United States Patent
Raaijmakers et al.

(10) Patent No.: US 7,323,422 B2
(45) Date of Patent: Jan. 29, 2008

(54) DIELECTRIC LAYERS AND METHODS OF FORMING THE SAME

(75) Inventors: Ivo Raaijmakers, Bilthoven (NL); Pekka J. Soininen, Espoo (FI); Jan Willem Maes, Hevelee (BE)

(73) Assignee: ASM International N.V. (NL)

( * ) Notice: Subject to any disclaimer, the term of this patent is extended or adjusted under 35 U.S.C. 154(b) by 392 days.

(21) Appl. No.: 10/379,516

(22) Filed: Mar. 4, 2003

(65) Prior Publication Data

US 2003/0234417 A1 Dec. 25, 2003

Related U.S. Application Data

(60) Provisional application No. 60/362,249, filed on Mar. 5, 2002.

(51) Int. Cl.
H01L 21/31 (2006.01)
H01L 21/469 (2006.01)

(52) U.S. Cl. .................................................. 438/758

(58) Field of Classification Search ............. 438/3, 438/240, 310, 758, 768, 785, 712, 396, 287, 438/142, 299, 210, 780
See application file for complete search history.

(56) References Cited

U.S. PATENT DOCUMENTS

| | | | | |
|---|---|---|---|---|
| 4,114,254 A | * | 9/1978 | Aoki et al. ................. | 438/299 |
| 6,011,272 A | * | 1/2000 | Omid-Zohoor et al. ....... | 257/44 |
| 6,020,243 A | | 2/2000 | Wallace et al. ............. | 438/287 |
| 6,140,189 A | * | 10/2000 | Hsu et al. .................. | 438/294 |
| 6,184,072 B1 | | 2/2001 | Kaushik et al. ............. | 438/197 |
| 6,207,589 B1 | | 3/2001 | Ma et al. .................... | 438/785 |
| 6,287,673 B1 | * | 9/2001 | Katsir et al. ................. | 428/210 |
| 6,297,539 B1 | | 10/2001 | Ma et al. ..................... | 257/410 |
| 6,300,203 B1 | | 10/2001 | Buynoski et al. ........... | 438/287 |
| 6,303,523 B2 | * | 10/2001 | Cheung et al. ............. | 438/780 |
| 6,306,721 B1 | * | 10/2001 | Teo et al. .................. | 438/396 |
| 6,320,238 B1 | | 11/2001 | Kizilyalli et al. ........... | 257/410 |
| 6,403,434 B1 | | 6/2002 | Yu .............................. | 438/300 |
| 6,420,279 B1 | | 7/2002 | Ono et al. ................... | 438/785 |
| 6,465,334 B1 | | 10/2002 | Buynoski et al. ........... | 438/591 |
| 6,472,276 B1 | | 10/2002 | Hilt et al. .................... | 438/285 |
| 6,528,386 B1 | * | 3/2003 | Summerfelt et al. ........ | 438/401 |
| 2001/0018787 A1 | * | 9/2001 | Shin et al. ................. | 29/25.01 |
| 2002/0024108 A1 | | 2/2002 | Lucovsky et al. .......... | 257/410 |

(Continued)

OTHER PUBLICATIONS

Semiconductor Manufacturing Technology; Copyright 2001; pp. 236-237, 275-277; by Michael Quirk and Julian Serda.*

*Primary Examiner*—Carl Whitehead, Jr.
*Assistant Examiner*—Monica D. Harrison
(74) *Attorney, Agent, or Firm*—Knobbe, Martens, Olson & Bear, LLP

(57) ABSTRACT

High dielectric constant (high-k) materials are formed directly over oxidation-susceptible conductors such as silicon. A discontinuous layer is formed, with gaps between grains of the high-k material. Exposed conductor underneath the grain boundaries is oxidized or nitridized to form, e.g., silicon dioxide or silicon nitride, when exposed to oxygen or nitrogen source gases at elevated temperatures. This dielectric growth is preferential underneath the grain boundaries such that any oxidation or nitridation at the interface between the high-k material grains and covered conductor is not as extensive. The overall dielectric constant of the composite film is high, while leakage current paths between grains is reduced. Ultrathin high-k materials with low leakage current are thereby enabled.

21 Claims, 9 Drawing Sheets

U.S. PATENT DOCUMENTS

| | | |
|---|---|---|
| 2002/0098627 A1 | 7/2002 | Pomarede et al. ........... 438/149 |
| 2002/0106536 A1 | 8/2002 | Lee et al. .................... 428/702 |
| 2002/0142624 A1 | 10/2002 | Levy et al. ................. 438/786 |
| 2002/0163039 A1 | 11/2002 | Clevenger et al. ........... 257/340 |
| 2002/0163058 A1 | 11/2002 | Chen et al. .................. 257/532 |
| 2004/0038529 A1* | 2/2004 | Soininen et al. ............. 438/685 |

* cited by examiner

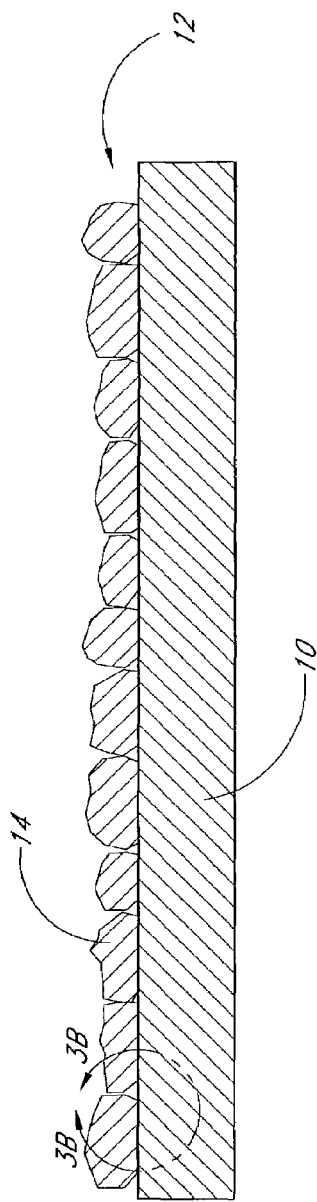
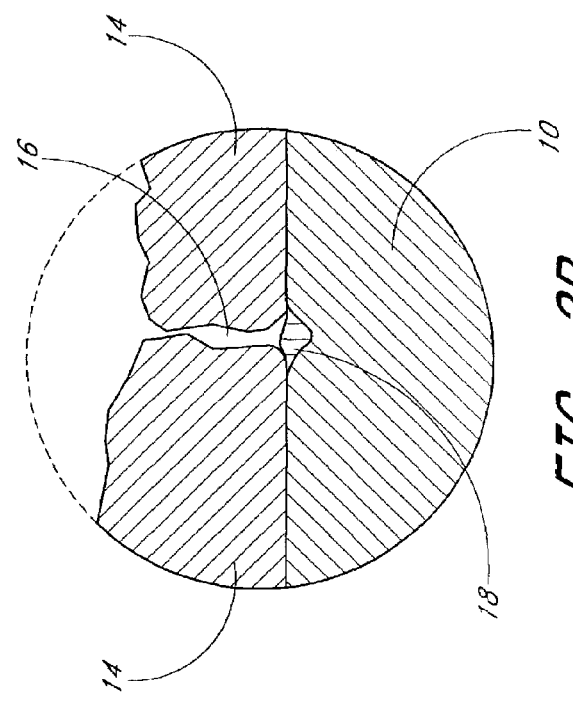
FIG. 3A
FIG. 3B

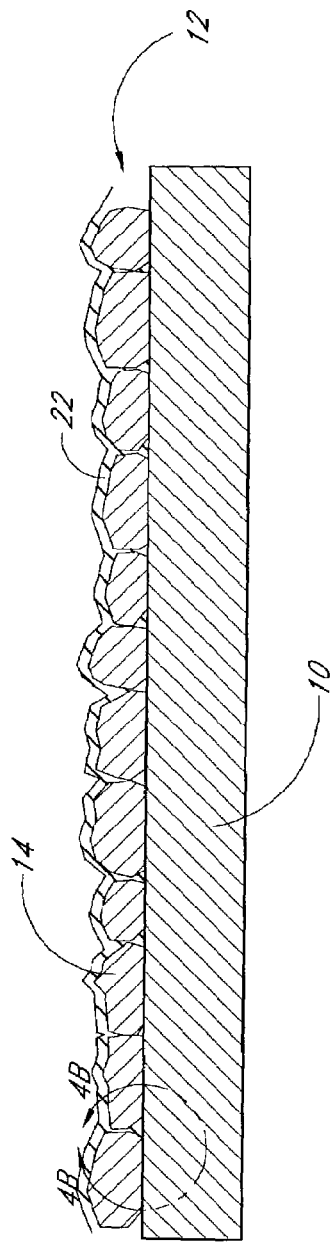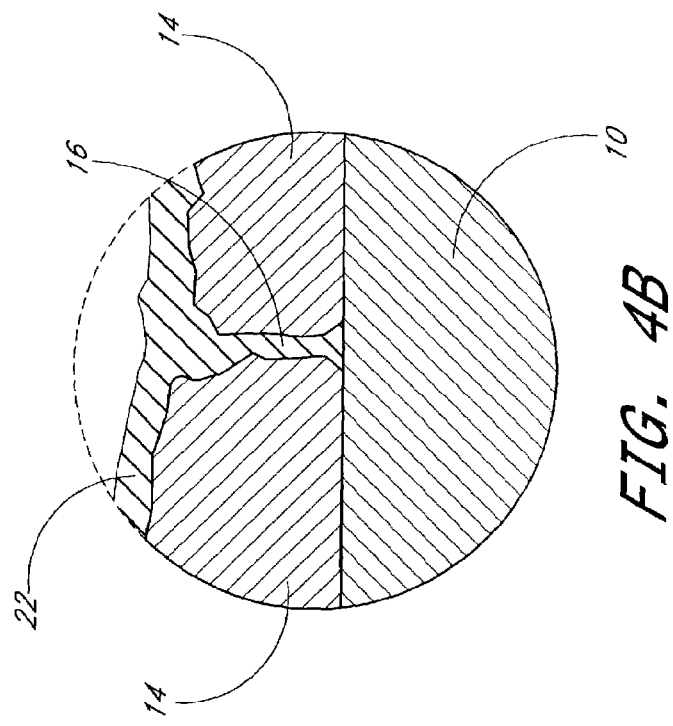
FIG. 4A
FIG. 4B

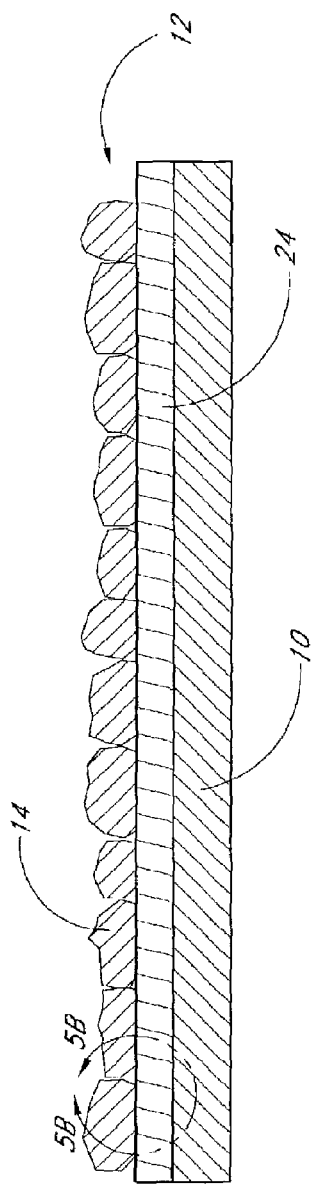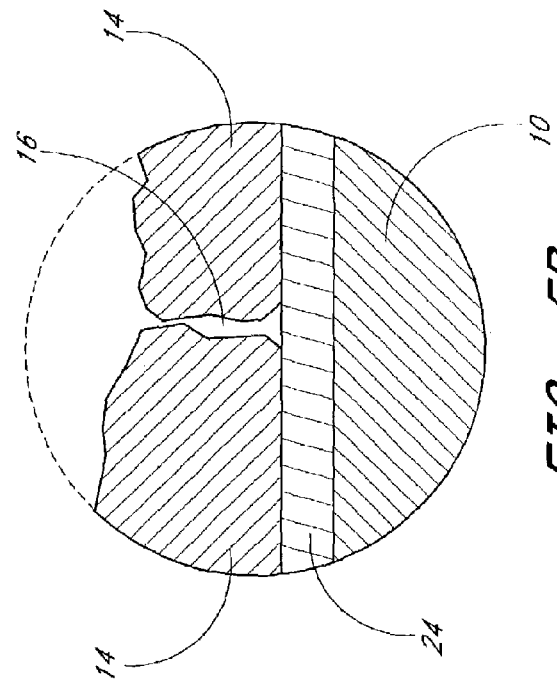

DIELECTRIC LAYERS AND METHODS OF FORMING THE SAME

REFERENCE TO RELATED APPLICATION

The present application claims the priority benefit under 35 U.S.C. §119(e) to U.S. provisional application No. 60/362,249, filed Mar. 5, 2002.

FIELD OF THE INVENTION

The present invention relates generally to the manufacturing of integrated circuits, and more particularly to the preparation of high-k dielectric layers in integrated circuits.

BACKGROUND OF THE INVENTION

Process control is very important in the fabrication of ultra-large scale integrated circuits. Through a series of deposition, doping, photolithography and etch steps, the starting substrate and subsequent layers are converted into integrated circuits, with a single substrate producing from tens to thousands or even millions of integrated devices, depending on the size of the wafer and the complexity of the circuits.

One area in which process control is particularly critical is the fabrication of transistor gate dielectrics. In the pursuit of ever faster and more efficient circuits, semiconductor designs are continually scaled down with each product generation. Transistor switching time plays a large role in the pursuit of faster circuit operation. Switching time, in turn, can be reduced by reducing the channel length of the transistors. In order to realize maximum improvements in transistor performance, vertical dimensions should be scaled along with horizontal dimensions. Accordingly, effective gate dielectric thickness, junction depth, etc. will all decrease with future generation integrated circuits.

High quality, thin dielectric layers are also desirable for memory cell capacitors. Integrated capacitors in memory arrays must exhibit a certain minimum capacitance for proper data storage and retrieval. As the chip area or "footprint" available per memory cell shrinks with each progressive generation of integrated circuits, the required capacitance per unit of footprint has increased. Many complex folding structures have been proposed for increasing capacitance through increased capacitor electrode surface area for a given cell footprint. Often, these structures require extremely complex fabrication steps, increasing the cost of processing significantly. Accordingly, other efforts to increase capacitance for a given memory cell space have focused on the capacitor dielectric, since reducing the thickness of the dielectric also increases overall capacitance.

Conventional thin dielectrics are formed of high quality silicon dioxide, also referred to herein as "silicon oxide." Ultra-thin silicon oxide layers (e.g., less than 5 nm), however, have been found to exhibit high defect densities, including pinholes, charge trapping states and, in transistor applications, susceptibility to hot carrier injection effects. Such high defect densities lead to leakage currents through the dielectric and rapid device breakdown unacceptable for circuit designs with less than 0.25 µm gate spacing, i.e., sub-quarter-micron technology. Moreover, even if the integrity of the silicon oxide is perfectly maintained, quantum-mechanical effects set fundamental limits on the scaling of silicon oxide. At high fields, direct tunneling dominates over Fowler-Nordheim tunneling and largely determines silicon oxide scaling limits. For example, in transistor gate dielectrics, these scaling limits have been estimated at about 2 nm for logic circuits, and about 3 nm for more leakage-sensitive memory arrays in dynamic random access memory (DRAM) circuits. See, e.g., Hu et al., "Thin Gate Oxides Promise High Reliability," SEMICONDUCTOR INTERNATIONAL (July 1998), pp. 215-222.

Theoretically, incorporating materials of higher dielectric constant into the dielectric opens the door to further device scaling. Higher dielectric constants (k) allow materials currently under investigation to exhibit the same capacitance as a thinner silicon dioxide layer, such that a lower equivalent oxide thickness (EOT) can be achieved without tunnel-limited behavior.

Silicon nitride has been investigated for its higher k value and diffusion barrier properties. However, silicon nitride has been found to exhibit a higher density of defects, such as interface trapping states, as compared to oxides. One solution to the individual shortcomings of oxides and nitrides is to produce a hybrid layer. Incorporating nitrogen into silicon oxide, to form silicon oxynitride, provides improved gate dielectrics. See, e.g., Leonarduzzi & Kwong, "improving Performance with Oxynitride Gate Dielectrics," SEMICONDUCTOR INTERNATIONAL (July 1998), pp. 225-230. Similarly, forming silicon nitride over thin silicon oxide layers, has been found to reduce defect densities while considerably lowering overall gate dielectric equivalent oxide thickness. See, e.g., Kim et al., "Ultra Thin (<3 nm) High Quality Nitride/Oxide Stack Gate Dielectrics Fabricated by In-Situ Rapid Thermal Processing," IEDM 97 (1997), pp. 463-466. The benefits of gate dielectrics made from silicon nitride are limited, however, because of the marginal increase in dielectric constant afforded by silicon nitride, particularly when used in conjunction with silicon oxide.

Accordingly, other efforts to increase capacitance have focused on materials with significantly higher dielectric constants (high-k materials). Certain metal oxides, such as barium strontium titanate (BST), strontium bismuth tantalate (SBT), hafnium oxide ($HfO_2$), zirconium oxide ($ZrO_2$) tantalum oxide ($Ta_2O_5$), etc., exhibit high relative permittivity (dielectric constant or k values) and are thus promising for fabricating gate dielectrics with increased capacitances. Several factors have limited the integration of such materials into current process flows, including the relative instability of high-k materials, a tendency to exhibit high defect densities, leakage currents, and the difficulty of avoiding oxidation of surrounding materials during high-k dielectric deposition and annealing.

To avoid problems with oxidation of surrounding materials, known techniques have focused on extremely complex integration techniques, the use of noble, non-oxidizing, or conductive oxide materials for electrodes and diffusion barriers in the process sequence. For example, such techniques are disclosed in U.S. Pat. No. 5,392,189; U.S. Pat. No. 5,619,393; U.S. Pat. No. 5,633,781; and U.S. Pat. No. 6,265,740 B1. Amorphous dielectric materials can decrease the leakage current, but the effective thickness of the insulating layer increases due to lower dielectric constants amorphous materials. Other references disclose the use of amorphous materials between grains of higher dielectric constant crystals. See, e.g., U.S. Pat. No. 4,464,701; U.S. Pat. No. 6,014,610; and U.S. Pat. No. 5,617,290. Relatively complex process flows, however, are required to achieve such structures, and the overall dielectric constant of multiple-layer dielectric structures dilutes the effect of the high-k materials.

A need exists, therefore, for more effective methods of forming high quality dielectric layers.

SUMMARY OF THE INVENTION

In accordance with one aspect of the invention, a process is provided for forming a thin dielectric film in an integrated circuit. The process includes forming a discontinuous layer of high dielectric constant material directly over a conductor. The discontinuous layer is formed with gaps. The conductor and discontinuous layer are then annealed in the presence of a reactive source chemical, thereby preferentially converting portions of the conductor exposed in the gaps to a second insulating material.

In accordance with another aspect of the invention, a method is provided for forming a high-k dielectric thin film over a conductor in an integrated circuit. The method includes depositing a high-k dielectric film directly over a conductive structure, the high-k dielectric film having a bulk dielectric constant k and a thickness of no more than about 1.5×(k/4) nm. The high-k dielectric film is annealed in a reactive atmosphere to form a layer of second dielectric material below the high-k dielectric film. The layer of second dielectric material has a nonuniform thickness.

In accordance with another aspect of the invention, an ultrathin, continuous and uniform dielectric is formed to a thickness of less than about 2 nm. A discontinuous layer of high-k dielectric material is formed on top of the continuous dielectric. The overall dielectric structure has a reduced areal average of the leakage current. In a preferred embodiment, the underlying dielectric is silicon oxide of less than about 0.5 nm thickness.

In accordance with another aspect of the invention, a method of forming an integrated circuit includes providing a conductive surface and forming a discontinuous, high dielectric constant layer on the conductive surface. Potential current leakage paths in physical gaps of the discontinuous, high dielectric constant layer are blocked with a second insulating material.

In accordance with another aspect of the invention, an integrated circuit is provided. The circuit includes a conductive structure with a discontinuous high-k dielectric layer directly overlying the conductive structure. The high-k dielectric layer includes a plurality of crystalline grains and a plurality of gaps among the grains.

BRIEF DESCRIPTION OF THE DRAWINGS

These and further aspects of the invention will be readily apparent to the skilled artisan from the following description and the attached drawings, wherein:

FIGS. 3A and 3B are schematic sectional views of the structure of FIGS. 2A and 2B after an annealing step in accordance with a preferred embodiment.

FIGS. 4A and 4B are schematic sectional views of the structure of FIGS. 2A and 2B after depositing a second dielectric layer over the metal oxide, in accordance with another embodiment.

FIGS. 5A and 5B are schematic sectional views of a discontinuous metal oxide over a semiconductor substrate, in accordance with another embodiment.

DETAILED DESCRIPTION OF THE PREFERRED EMBODIMENTS

Figure 1:
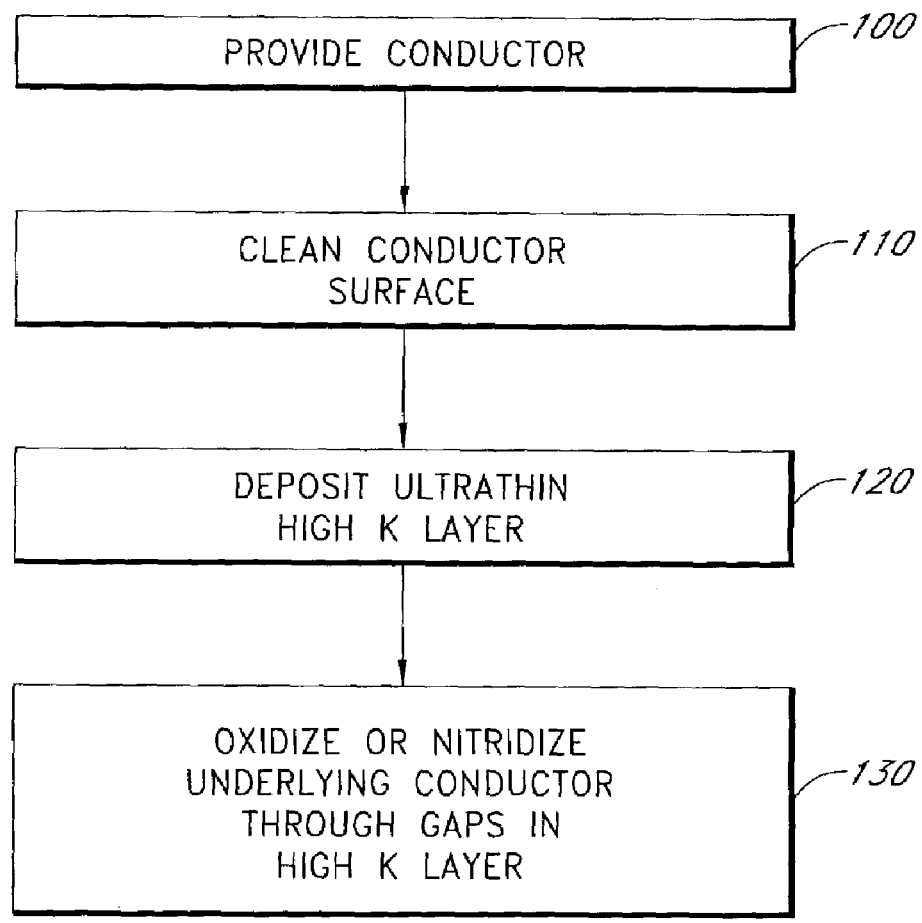
FIG. 1 is a flowchart generally illustrating a process in accordance with the preferred embodiments.

While illustrated in the context of forming a dielectric material over a silicon conductive structure, the skilled artisan will readily appreciate the application of the principles and advantages disclosed herein to deposition over other conductors that are subject to oxidation. For example, and without limitation, the dielectric layer formation processes and structures disclosed herein are applicable to deposition over tantalum, tungsten, titanium, aluminum, etc. The conductor preferably oxidizes to form an amorphous dielectric. The skilled artisan will readily appreciate that the processes and structures disclosed herein are applicable to various contexts in which high dielectric constant materials are useful, including transistor gate stacks as well as memory cell capacitors for random access memory arrays.

As is known in the art, high dielectric constant materials (high-k materials) are typically annealed at high temperatures to crystallize the materials and to increase their dielectric constants. Typically, the anneal is conducted in a highly oxidizing environment to avoid reduction of oxygen content from the high-k layer. The highly oxidizing environment and high temperatures typically employed in such oxidation anneal steps tend to cause a high degree of oxygen diffusion through the layer. Conventional processes for integrating high-k materials, therefore, tend to focus on choices of surrounding materials and process sequences that avoid oxidation of underlying materials during the anneal.

While the higher dielectric constants of crystalline materials are advantageous, the formation of grain boundaries in the dielectric may increase the leakage current during device operation since charge carriers tend to migrate through the dielectric along grain-boundary surfaces when a voltage is applied over the dielectric. Using amorphous materials instead of crystalline can reduce leakage currents, but at the cost of a lower dielectric constant.

In accordance with the preferred embodiments, the advantages of crystalline high-k materials are balanced with the advantages of amorphous materials with lower dielectric constants, but with decreased leakage currents. The electrical conductivity through grain boundaries is advantageously reduced by forming insulating areas on an underlying conductor (e.g., silicon) that is located beneath the high-k thin film. Exposed portions of the conductor under the grain boundaries are preferably oxidized or nitridized in the presence of an oxygen-containing or nitrogen-containing source at elevated temperatures. Thus, oxidation or nitridation of the underlying conductor preferentially occurs between grains of the high-k material. The interface between high-k material grains and the underlying conductor, particularly silicon, is not as greatly affected by the oxidation process, which is carefully selected to avoid excessive oxidation beneath the grain boundaries. Overall, the dielectric constant of the high-k film remains relatively high, while leakage current through the dielectric is reduced by "plugging" the leakage paths between the grains.

The high-k dielectric material can be formed by any suitable process including physical vapor deposition (PVD), chemical vapor deposition (CVD), or atomic layer deposition (ALD). The high-k dielectric material is initially an ultrathin layer. The relative thickness of a high-k layer, insofar as its effect on device performance, depends upon the relative permittivity or dielectric constant (k) of the material, such that the thickness can be defined in terms of k. Preferably, the high-k dielectric has a thickness (in nm) less than about $2\times(k/4)$ in thickness, more preferably less than about $1.5\times(k/4)$, and most preferably between about $0.2\times(k/4)$ and about $1.0\times(k/4)$ in thickness. For example, because $ZrO_2$ has a k value of about 20, $ZrO_2$ layers in accordance with certain embodiments are most preferably between about 1 nm and about 5 nm thick. More generally, the absolute thickness of the high-k film is preferably less than 100 Å (10 nm), more preferably, less than about 50 Å.

In the preferred range of thicknesses, the dielectric layer will tend to have gaps between grains of the high dielectric material. Such gaps may result during thin film deposition, due to islanding effects, or can also form after deposition during a high temperature treatment or annealing. Such treatments can improve the crystallinity of the film, but can also cause shrinkage or otherwise cause separation of grains. Accordingly, in accordance with certain aspects of the invention, the high-k material is initially a discontinuous film.

Preferably, the high-k material is deposited by atomic layer deposition (ALD), which advantageously enables formation of extremely thin layers in the preferred thickness ranges with excellent conformality. ALD involves alternating surface reactions of vapor phase reactants or precursors. Deposition temperatures are preferably maintained within a window above the condensation temperatures of the vapor phase reactants but below the temperature at which thermal decomposition of the reactants will occur. Accordingly, a first vapor phase reactant pulse chemically adsorbs upon the substrate, followed by removal of excess first reactant, such as by evacuation and/or purging. The first reactant self-limitingly forms no more than about one monolayer on the substrate. Preferably, the reactant precursor includes ligands that remain on the adsorbed monolayer, preventing further reaction. The first reactant thus saturates available surface sites. After removal of excess first reactant, a second vapor phase reactant is brought into contact with and reacts with the adsorbed species of the first reactant. For example, the second reactant may strip ligands from the adsorbed species of the first reactant, or may replace them in a ligand-exchange reaction. After a saturative pulse, excess second reactant and any by-product is removed from the chamber, such as by evacuation and/or purging. This cycle of first reactant pulse, removal, second reactant pulse, removal can be repeated as many times as desired, depending upon the desired thickness of the ALD deposited layer. Each cycle can also include one or more additional reactant pulse(s) and corresponding removal steps, depending upon the complexity of the material being deposited.

General principles of ALD and its manner of operation are described more thoroughly in T. Suntola, *Handbook of Crystal Growth III, Thin Films and Epitaxy*, "Part B: Growth Mechanisms and Dynamics, Ch. 14, Atomic Layer Epitaxy," pp. 601-663, Elsevier Science B.V. (1994), the disclosure of which is expressly incorporated herein by reference.

Even with the excellent conformality afforded by ALD, a high-k material can still form in a discontinuous fashion. Such discontinuity may be due to post-deposition shrinkage during a crystallization step. Moreover, because of the thinness of the preferred high-k layers, even ALD will not afford perfect coverage with each cycle. This phenomenon arises from the inherent steric interactions between molecules adhering to the substrate in each pulse. For example, large organic ligands can physically prevent occupation of every available site during each pulse. Accordingly, rather than a full monolayer per cycle, two, three, five or even more cycles may be required, on average, to complete a full monolayer. This steric hindrance effect can also contribute to discontinuities in the thickness of the deposited layer in certain preferred embodiments.

The high-k dielectric materials employed in the preferred embodiments preferably comprise a metal oxide including at least one element from groups IIA, IIIB, and IVB of the periodic table. The high-k dielectric layer can be a multi-layered metal oxide, solid metal oxide solution, ternary compound, doped metal oxide, etc. Preferably, the metal oxide does not react with the underlying conductor, which comprises silicon in the exemplary embodiments described below.

Oxides of group IIA include well-known high-k oxides such as barium strontium titanate (BST), strontium titanate (ST), strontium bismuth tantalate (SBT), lead strontium titanate (PST), etc.

Oxides of group IVB suitable for use as a high-k material in accordance with the preferred embodiments include zirconium oxide ($ZrO_2$) and hafnium oxide ($HfO_2$).

Group IIIB elements are also known as rare earth elements. Within this group, rare earth oxides are preferably selected from a group of oxides for which the (III) oxidation state is the single most stable, namely scandium oxide ($Sc_2O_3$), yttrium oxide ($Y_2O_3$), lanthanum oxide ($La_2O_3$), gadolinium oxide ($Gd_2O_3$), holmium oxide ($Ho_2O_3$), erbium oxide ($Er_2O_3$), and lutetium oxide ($Lu_2O_3$). Oxides of the rare earth elements Ce, Pr, and Tb have two oxidative states (III and IV). Among oxides of these elements, the higher oxidation state (IV) oxides $CeO_2$, $PrO_2$ and $TbO_2$ are preferably not employed in contact with silicon. Oxides of metals from this group in the lower oxidation state (III), namely $Ce_2O_3$, $Pr_2O_3$ and $Tb_2O_3$, can be employed in direct contact with silicon in certain preferred embodiments. Oxides of the rare earth elements Nd, Sm, Eu, Dy, Tm, and Yb are not preferred their binary oxides are more stable in the (II) oxidation state than the (III) oxidation state. Oxides of the higher oxidation state (III) of these elements has the form $X_2O_3$, while oxides of the lower oxidation state (II) has the form XO, where X represents a rare earth element.

Referring now to FIG. 1, a general process sequence in accordance with the preferred embodiments is shown. Initially, a conductor is provided 100. The conductor can comprise any suitable material that is subject to oxidation. For example, the conductor can comprise tantalum, tungsten, aluminum, titanium, etc.

Preferably, the conductor comprises a conductively doped silicon. More preferably, the silicon comprises a single crystal structure, such as an epitaxial silicon layer or the top surface of a monolithic silicon wafer. In a preferred embodiment, the structure to be formed is a transistor gate stack. In another preferred embodiment, the silicon conductor is the bottom electrode for a memory cell capacitor. Advantageously, because the preferred embodiments enable forming high-k materials over silicon surfaces, the electrode can assume any configuration known in the art for maximizing the surface area of the capacitor bottom electrode, including hemispherical grained silicon (HSG-Si). Forming high-k materials in contact with silicon substrates has been avoided in the past because of the high risk of oxidizing the silicon substrate using conventional high-k dielectric formation processes.

Next, the surface of the conductor is preferably cleaned 110 of any native oxides, if necessary. Such cleaning may be conducted, for example, for silicon conductors by an ex situ cleaning involving a standard clean 1 (SC1)/HF wet etch bath. Alternatively, an integrated HF and acetic acid vapor cleaning can be conducted in a neighboring module within a cluster tool, reducing transport time and opportunities for recontamination or oxidation. In a preferred embodiment, the cleaning oxide left by the SC1 step is not removed, but is instead used as an initial, protective oxide layer to be removed inside the reaction chamber. Preferably, the cleaning oxide is removed in a hydrogen bake step within the same reaction chamber in which deposition of the high-k dielectric is to be performed. As is known in the art, the hydrogen bake step involves elevated temperatures in the presence of a reducing agent (typically hydrogen) to sublimate native oxide or an intentional protective oxide. Small amounts of HCl vapor can be added to the hydrogen bake step for cleaning metal contaminants and the like. In another embodiment, plasma products can assist or conduct in situ cleaning, such as by substituting H radicals from a remote microwave generator for hydrogen gas.

Either after ex situ cleaning or prior to in situ cleaning, the workpiece bearing the conductor is loaded into a process chamber for high-k dielectric material deposition 120. As noted above, any suitable process may be used to deposit the high-k material. Preferably, the deposition is by atomic layer deposition (ALD), more preferably, for a sufficient number of cycles to deposit a layer with the preferred thicknesses described hereinabove. The preferred thin layers of high-k material are typically deposited as discontinuous layers on the conductor. In the event that a continuous layer is formed, a non-uniform thickness can result in the preferential conversion of the underlying conductor under the thinnest portions of the high-k dielectric during the subsequent process, described in detail below.

After deposition 120, the high-k layer can optionally be subjected to an independent anneal step to help crystallize the high-k layer. Such independent crystallization, if conducted, may cause gap formation even if the high-k dielectric was deposited as a continuous layer. Preferably, however, this independent crystallization step is omitted in favor of crystallization during the subsequent process, described below.

Following deposition 120, the layer is subjected to a "light" oxidation or nitridation 130 to convert the portions of the conductor exposed by the gaps in the discontinuous high-k layer to a filler dielectric. As used herein, the term "oxidation" may refer to reactions that form oxide, or reactions that form oxide or nitride. The particular meaning in each case may be ascertained by context. Conditions are carefully selected to ensure oxide or nitride formation on the conductor through the gaps in the high-k material, without excessive oxidation under the high-k material grains. Advantageously, the filler dielectric formed on the conductor surface plugs leakage paths along the gaps and will also tend to expand into the gaps in the high-k dielectric themselves. Preferably, for dielectrics on silicon, temperatures during the oxidation are maintained between about 300° C. and about 900° C. for between about 1 second and about 3600 seconds, depending upon the oxygen source employed, which can be selected from the compounds described below. An exemplary oxidant is dry and dilute $O_2$, for which more preferred temperatures for a light oxidation are between about 650° C. and about 850° C., preferably for between about 60 seconds and about 600 seconds. In the case of dry $O_2$, the $O_2$ partial pressure is preferably less than about $10^{-2}$ Torr It will be understood that for dielectrics on metal electrodes the preferred temperatures may be lower than those described above for dielectrics on silicon. For example, for a $TiN/Ta_2O_5/TiN$ capacitor, the oxidation can be performed at less than about 600° C. and even at temperatures as low as about 450° C. Under plasma conditions, or when remotely generated radicals are provided to the chamber during the light oxidation step, the temperatures may even be in the range of from about 200° C. to about 300° C.

FIGS. 2 and 3 illustrate a preferred embodiment in which a high-k material is formed over a silicon conductor 10. As noted, the conductor can comprise other materials in other embodiments. Silicon, however, has particular advantages as a channel material for a MOSFET, and as a high surface-area electrode for a memory cell capacitor.

Figure 2A:
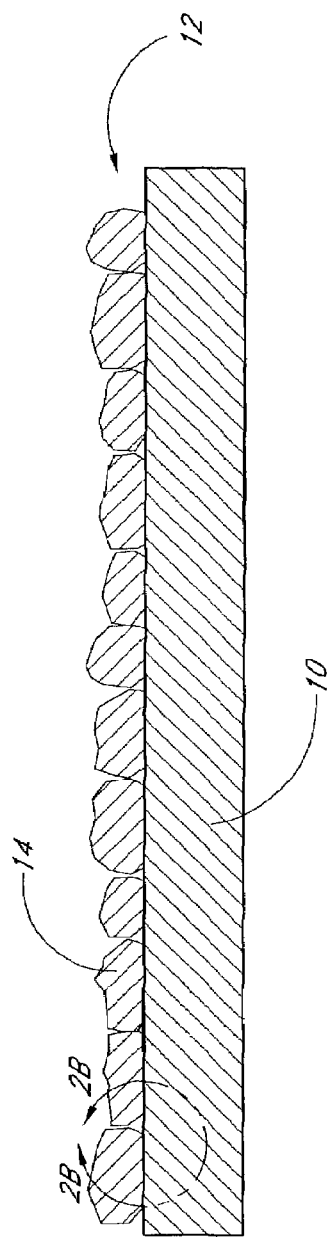
FIGS. 2A and 2B are schematic sectional views of a metal oxide over a semiconductor substrate, constructed in accordance with a preferred embodiment of the invention.
Figure 2B:
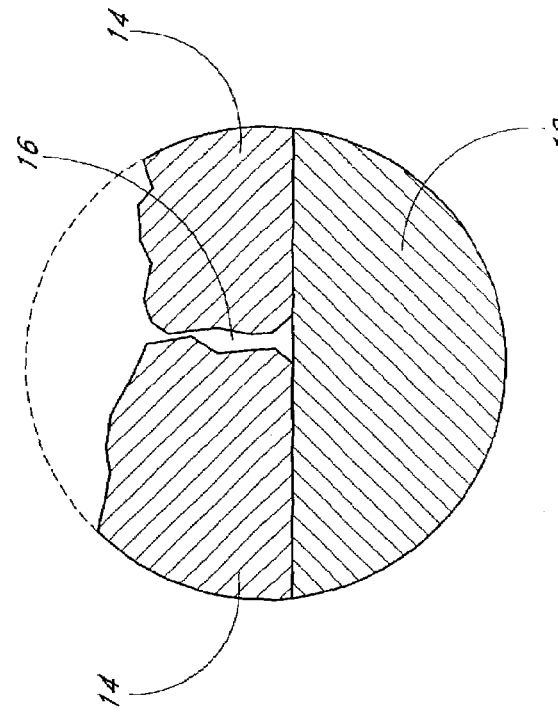

In FIG. 2A, a high-k metal oxide film 12 has been formed over the conductor 10. As illustrated in FIG. 2B, the high-k film 12 is a discontinuous film comprising a plurality of crystal grains 14 having gaps 16 therebetween. As noted above, the gaps 16 may have formed during the thin film deposition, due to an islanding effect, or after deposition during a high temperature treatment, which is often conducted to improve the crystallinity of the film and increase the dielectric constant.

FIGS. 3A and 3B illustrate the structure illustrated in FIGS. 2A and 2B after an exemplary oxygen anneal step. During the anneal, oxygen preferentially diffuses through the gaps 16 illustrated in FIG. 3B and oxidizes the underlying silicon surface of the illustrated conductor 10. Silicon oxide ($SiO_2$) filler 18 thus preferentially forms underneath and expands into the gaps 16. The silicon oxide 18 effectively reduces the leakage currents along the grain boundaries. The surface area covered by these filler spots 18 is preferably less than about 20% of the total conductor surface area, more preferably less than about 5%, and most preferably less than about 1%. It will be understood that these percentages represent the surface area occupied by the preferentially formed filler spots 18. While absence of the grown filler dielectric 18 underneath grains is preferred, in some embodiments an identifiably thinner dielectric will form under the grains 14. In such embodiments, the percentage of surface covered by the thicker filler spots 18 will still preferably fall within the preferred ranges set forth above. Accordingly, whether discontinuously (as preferred) or continuously formed, these filler spots 18 have a small effect on the overall dielectric constant of the dielectric layer 12.

Thus, the overall dielectric structure illustrated in FIGS. 2A and 3B comprises a discontinuous high-k dielectric layer 12 in registration with a discontinuous, underlying, and partially overlapping silicon oxide layer formed by a plurality of filler spots 18. Preferably, the filler spots 18 comprise an amorphous dielectric. The dielectric spots 18 have a lower dielectric constant than the grains 14 of the high-k layer 12, but account for only a small amount of the material, and so, do not significantly reduce the dielectric constant of the overall dielectric structure. However, the overlap of these filler spots 18 with the gaps 16 in the high-k layer 12 blocks leakage paths through the high-k dielectric layer 12.

Note that, while the filler 18 is illustrated as discontinuously formed only underneath the gaps 16, it will be understood that a small amount of oxidation at the interface between high-k grains 14 and the conductor 10 can also occur under some conditions. However, such oxidation is small in the preferred embodiments, compared to oxidation through the gaps 16. Accordingly, any oxidation underneath the grains 14 preferably averages at most about 30% of the thickness of the oxidation in the filler spots 18 underneath the gaps 16. More preferably, oxidation under the grains 14 averages less than 10% of the thickness of the oxidation under the gaps 16.

In the exemplary embodiment, wherein silicon dioxide is formed underneath the gaps and within the gaps between the high-k material grains, further reactions can also occur between the resultant silicon dioxide and the high-k material. Such further reactions will produce metal silicates, which have a higher dielectric constant than silicon dioxide and can similarly reduce the leakage current flowing along the grain boundaries.

Alternatively or additionally, a discontinuous high-k layer, as illustrated in FIGS. 2A and 2B, can be formed, followed by deposition of a filler dielectric film, preferably amorphous, thereover. Referring to FIGS. 4A and 4B, a deposited silicon oxide film 22 can fill gaps 16 between grains 14 of the discontinuous high-k material 12. Such a composite film would have silicon oxide 22 blocking current leakage paths through the gaps 16 between grains 14 and, unlike the embodiment illustrated in FIGS. 3A and 3B, also includes silicon oxide 22 overlying the grains 14 of the high-k material. Deposition by ALD of silicon oxide or another amorphous dielectric can even deposit material into the very small gaps 16 between grains 14 sufficient to block potential current leakage paths.

Another embodiment of the invention is illustrated in FIGS. 5A and 5B. In contrast to the embodiments described above, this embodiment comprises first forming a continuous, low-k dielectric layer 24 over the conductor 10. Layer 24 is also referred to herein as an interfacial dielectric layer. A discontinuous layer of a high-k material 12 is deposited over the oxide interlayer 24. For example, a silicon oxide layer can be formed over a silicon substrate prior to depositing the high-k material. The continuous layer is ultrathin, preferably, less than about 2 nm thick, more preferably, less than about 1 nm thick, and most preferably, no more than about 0.5 nm thick. In a preferred embodiment, the interfacial dielectric layer 24 is a 0.5 nm silicon oxide layer formed over a silicon wafer by rapid thermal oxidation (RTO). The silicon oxide layer can be formed by $O_2$ thermal oxidation, but is more preferably formed by NO thermal oxidation.

Following the deposition of the discontinuous high-k dielectric material 12, the structure is preferably subjected to an anneal, preferably, an oxidation or a nitridation anneal. Conditions for the anneal are preferably selected to minimize, and more preferably, to avoid further growth of the underlying interfacial, low-k dielectric layer 24.

Oxygen Source Chemicals

In certain of the illustrated embodiments described above, oxidation is conducted through gaps between high-k material grains. The oxygen source gas is preferably a volatile or gaseous compound that contains reactive oxygen and is capable of reacting with the conductor exposed in the gaps under the preferred annealing conditions, resulting in the formation of an oxide of the conductor. Typically, this oxide in the gaps will be different from the oxide of the high-k material.

Exemplary oxygen source gases include, but are not limited to, oxygen ($O_2$), ozone ($O_3$), oxygen with unpaired electrons (i.e., atomic oxygen), oxygen ions, hydrogen peroxide ($H_2O_2$), organic peroxides, organic ozonides, peracids, water ($H_2O$), alcohols, and $N_2O$. Mixtures of such source chemicals, optionally diluted with inert gases, can also be used. See, for example, PCT publication No. WO 99/35311, published Jul. 15, 1999, the disclosure of which is incorporated by reference herein, which discloses that an oxygen source gas, optionally diluted with an inert gas. As disclosed in this reference at, e.g., p. 7, lines 12-27, the oxygen is preferably stored diluted to less than the explosive limit for the given reaction chamber conditions. Preferably, such dilute oxygen source containers contain less than about 6% oxygen diluted with an inert gas, more preferably between about 1% and about 5% oxygen diluted in an inert gas.

Nitrogen Source Chemicals

As an alternative to oxidation, it is contemplated that the filler material in the gaps can be formed by nitridation after forming the high-k dielectric layer 12. A nitrogen source gas is preferably a volatile or gaseous compound that contains reactive nitrogen and is capable of reacting with the exposed conductor underneath the gaps among grains under the annealing process conditions. A nitride, such as silicon nitride, thereby forms on the conductor surface and expands into the gaps between grains of the high-k dielectric material.

Exemplary nitrogen source chemicals include, but are not limited to, nitrogen with unpaired electrons (i.e., atomic nitrogen), excited nitrogen, ammonia ($NH_3$), hydrazine ($N_2H_4$), hydroxylamine, and hydrogen azide. Mixtures of such chemicals, optionally diluted with inert gases, can also be used.

EXAMPLE 1

In this example, a high-k dielectric layer is formed on a silicon substrate by ALD. The skilled artisan will appreciate, however, that the high-k dielectric material can be formed by any suitable method (e.g., MOCVD).

Zirconium dioxide ($ZrO_4$) was deposited by ALD onto a silicon substrate as follows. In pulse A, $ZrCl_4$ vapor was introduced to the reaction chamber, exposing the wafer surface for 1.5 s. In purge A, the reaction chamber was purged with nitrogen gas for 3.0 s to remove excess $ZrCl_4$ and reaction byproducts. Pulse A and purge A are together referred to as the "metal phase." In pulse B, water vapor was introduced to the reaction chamber, exposing the wafer surface for 3.0 s. In purge B, residual $H_2O$ and reaction byproducts were removed by purging the reaction chamber with nitrogen gas for 4.0 s. Pulse B and purge B are together also referred to as the "oxygen phase." During each of the reaction phases, the reactants were supplied in sufficient quantities to saturate the surface of the substrate.

This exemplary high-k deposition cycle is summarized in Table I.

TABLE I

| Phase | Reactant | Temperature (° C.) | Pressure (mbar) | Time (sec) |
|---|---|---|---|---|
| Pulse A | $ZrCl_4$ | 300 | 5-10 | 1.5 |
| Purge A | $N_2$ | 300 | 5-10 | 3.0 |

TABLE I-continued

| Phase | Reactant | Temperature (° C.) | Pressure (mbar) | Time (sec) |
|---|---|---|---|---|
| Pulse B | $H_2O$ | 300 | 5-10 | 3.0 |
| Purge B | $N_2$ | 300 | 5-10 | 4.0 |

The ALD cycle described in Table I was repeated between 34 times and 170 times. The average deposition rate was about 0.59 Å/cycle at 300° C., providing a layer of $ZrO_2$ from about 20 Å to about 100 Å thick.

Generally, ALD is performed at from about 200° C. to about 500° C. For an amorphous $ZrO_2$ layer, the temperature is preferably at the lower end of this range, between about 200° C. and about 250° C., more preferably, about 225° C. For a crystalline $ZrO_4$ layer, the temperature is preferably at the higher end of this range, between about 250° C. and about 500° C., more preferably, about 300° C. As will be appreciated by the skilled artisan, however, mixtures of amorphous and crystalline material are deposited at temperatures around the boundary of these two temperature regimes. The illustrated process produces a largely crystalline $ZrO_2$ film.

In the present example, the metal monolayer formed in the metal phase is self-terminated with chloride, which does not readily react with excess $ZrCl_4$ under the preferred conditions. The preferred oxygen source gas, however, reacts with the chloride-terminated surface during the oxygen phase in a ligand-exchange reaction, which is limited by the number of previously adsorbed of zirconium chloride complexes. Moreover, the reaction between $ZrO_4$ and water results in hydroxyl and oxygen bridge termination that does not further react with excess oxidant in the saturative phase.

Preferably, sufficient cycles are conducted to grow a layer of $ZrO_4$ from about 20 Å to about 100 Å thick, more preferably, from about 20 Å to about 40 Å thick, to maximize the likelihood that the deposited high-k layer is discontinuous. The dielectric constants of the preferred layers are from about 18 to about 24. In the illustrated example, 30 Å of $ZrO_2$ was deposited.

Following ALD deposition of $ZrO_4$, a light oxidation was performed to convert exposed silicon in the gaps of the high-k layer to silicon oxide, thereby blocking potential current leakage paths. Advantageously, conditions are selected under which oxidation preferentially occurs at the gaps, with little or no oxidation occurring at the silicon-$ZrO_2$ interface. In a preferred embodiment, $N_2O$ is the oxygen source chemical. In another preferred embodiment, dilute $O_2$ in an inert gas is the oxygen source chemical. Preferably, the temperature of the oxidation reaction is not greater than about 900° C., more preferably, between about 600° C. and about 800° C. The oxidation is preferably performed for between about 30 seconds and about 60 seconds. The skilled artisan will appreciate that the reaction time and temperature are interrelated. In another preferred embodiment, a light nitridation of silicon exposed by the gaps is performed using dilute $NH_3$ at from about 600° C. to about 800° C.

One skilled in the art will realize that $HfO_2$ may be deposited by ALD under conditions analogous to those described for $ZrO_2$ in the present example using a hafnium source, for example, $HfCl_4$, as the metal phase rather than $ZrCl_4$. The skilled artisan would further understand that a light oxidation of the underlying silicon substrate in a post-deposition anneal would proceed analogously.

EXAMPLE 2

FIGS. 6-9 illustrate experimental results of oxidation and nitridation anneals of 4.0 nm ALD $Al_2O_3$ or $HfO_2$ layers on 0.5 nm RTO (rapid thermal oxide) $SiO_2$, an interfacial layer (24 in FIG. 5A). Anneals were performed at from 600° C. to 1000° C. for 60 s. The wafers were then annealed at 400° C. under forming gas before measurement of an EOT parameter. This second anneal does not affect the interface oxide. In these examples, an EOT parameter was measured using a Corona-Oxide-Si (COS) method on a COS Quantox system (KLA-Tencor Corp.). The EOT parameter (GateTox™) is the accumulation capacitance, expressed in Å.

Figure 6:
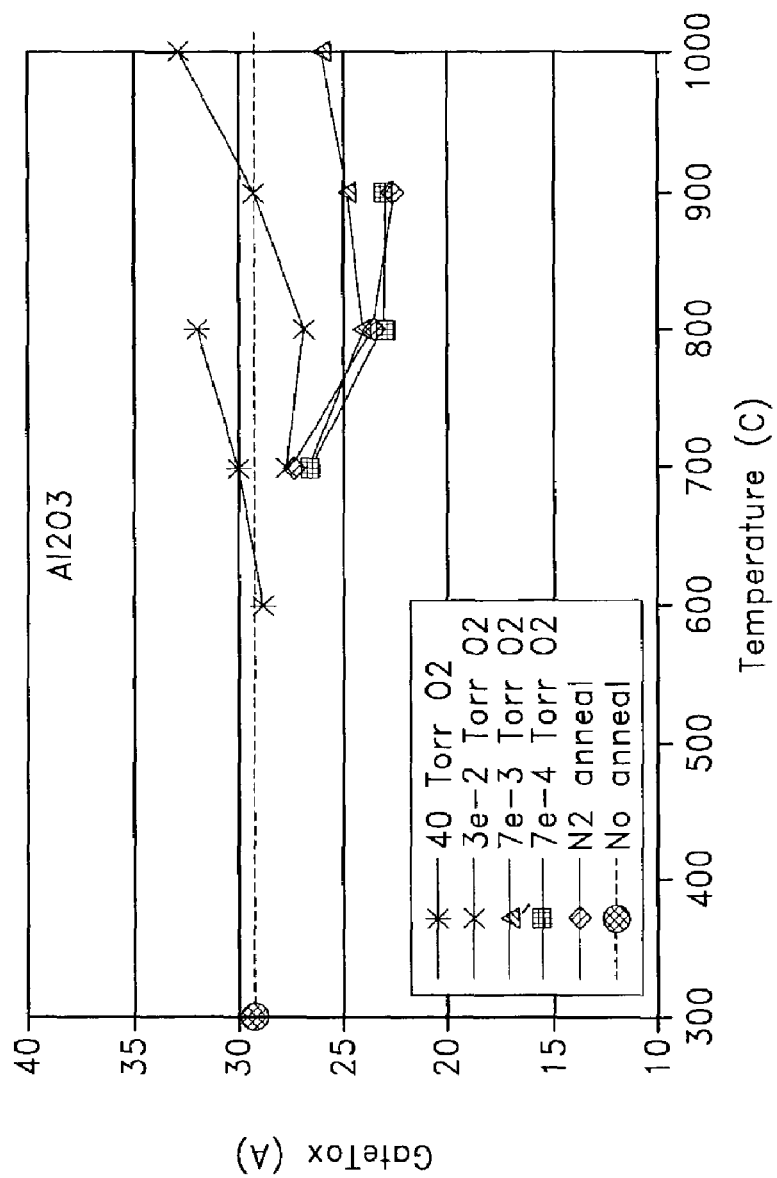
FIG. 6 illustrates experimental results of subjecting a dielectric stack of 4 nm $Al_2O_3$ over 0.5 nm silicon oxide to annealing, showing equivalent oxide thickness versus anneal temperature after annealing under various conditions.

FIG. 6 illustrates the EOT of $Al_2O_3$ dielectric layers under a series of oxidation annealing conditions. The EOT increased under higher oxygen concentrations (40 Torr and $3\times10^{-2}$ Torr) at higher temperatures. The $Al_2O_3$ high-k layer was stable up to from about 900° C. to about 1000° C. under sufficient oxygen concentrations. EOT decreased in lean oxygen anneals. The EOT from the leanest oxygen anneal was the similar to that for an $N_2$ anneal.

Figure 7:
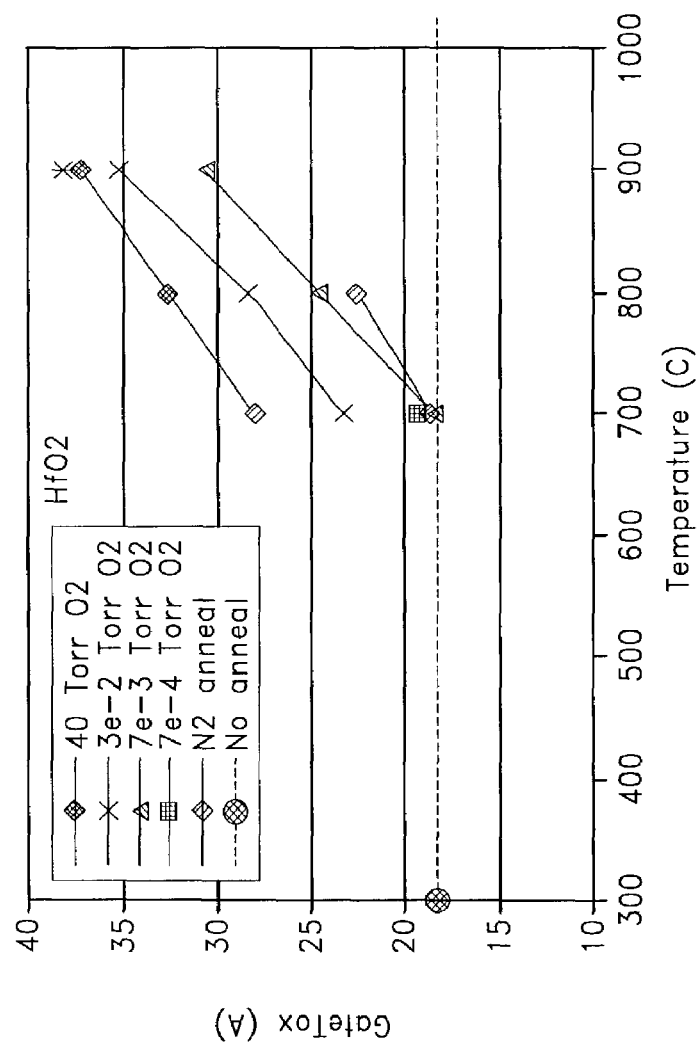
FIG. 7 illustrates experimental results of subjecting a dielectric stack of 4 nm $HfO_2$ over 0.5 nm silicon oxide to annealing, showing equivalent oxide thickness versus anneal temperature after annealing under various conditions.

FIG. 7 illustrates a series of similar experiments for $HfO_2$ dielectric layers. In these experiments, annealing under $N_2$ increased EOT compared to an unannealed layer. Oxidative annealing, however, increased the EOT to an even greater extent, with higher annealing temperatures and oxygen concentrations providing higher EOT values. In no case did the EOT decrease, as was observed for $Al_2O_3$ in FIG. 6.

Figure 8:
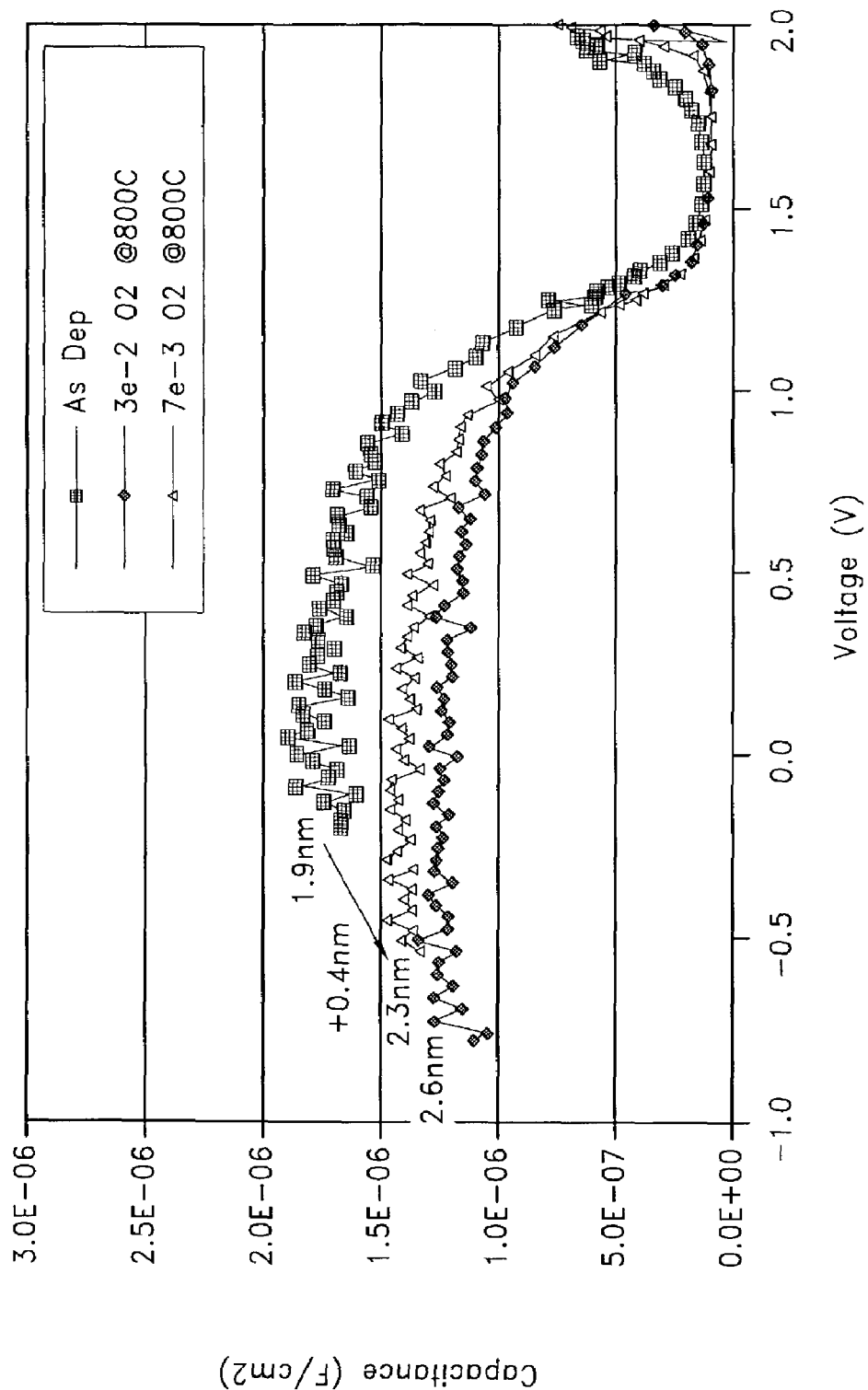
FIG. 8 is a capacitance-voltage curve showing electrical behavior (and consequently calculated equivalent oxide thickness) after annealing a dielectric stack of 4 nm $HfO_2$ over 0.5 nm silicon oxide with two different concentrations of $O_2$.

FIG. 8 illustrates capacitance-voltage curves for 4 nm $HfO_2$ layers deposited on 0.5 nm RTO after oxidative annealing. The upper trace shows the capacitance of the $HfO_2$ layer as deposited. The EOT parameter for this material was 1.9 nm. The second trace shows the capacitance after an 800° C., 60 s anneal under $7\times10^{-3}$ Torr $O_2$. The EOT parameter increased to 2.3 nm. The third trace shows the capacitance after an 800° C., 60 s anneal under $3\times10^{-2}$ Torr $O_2$. The EOT parameter increased to 2.6 nm. In these experiments, increasing oxygen concentration correlated with increased EOT.

Figure 9:
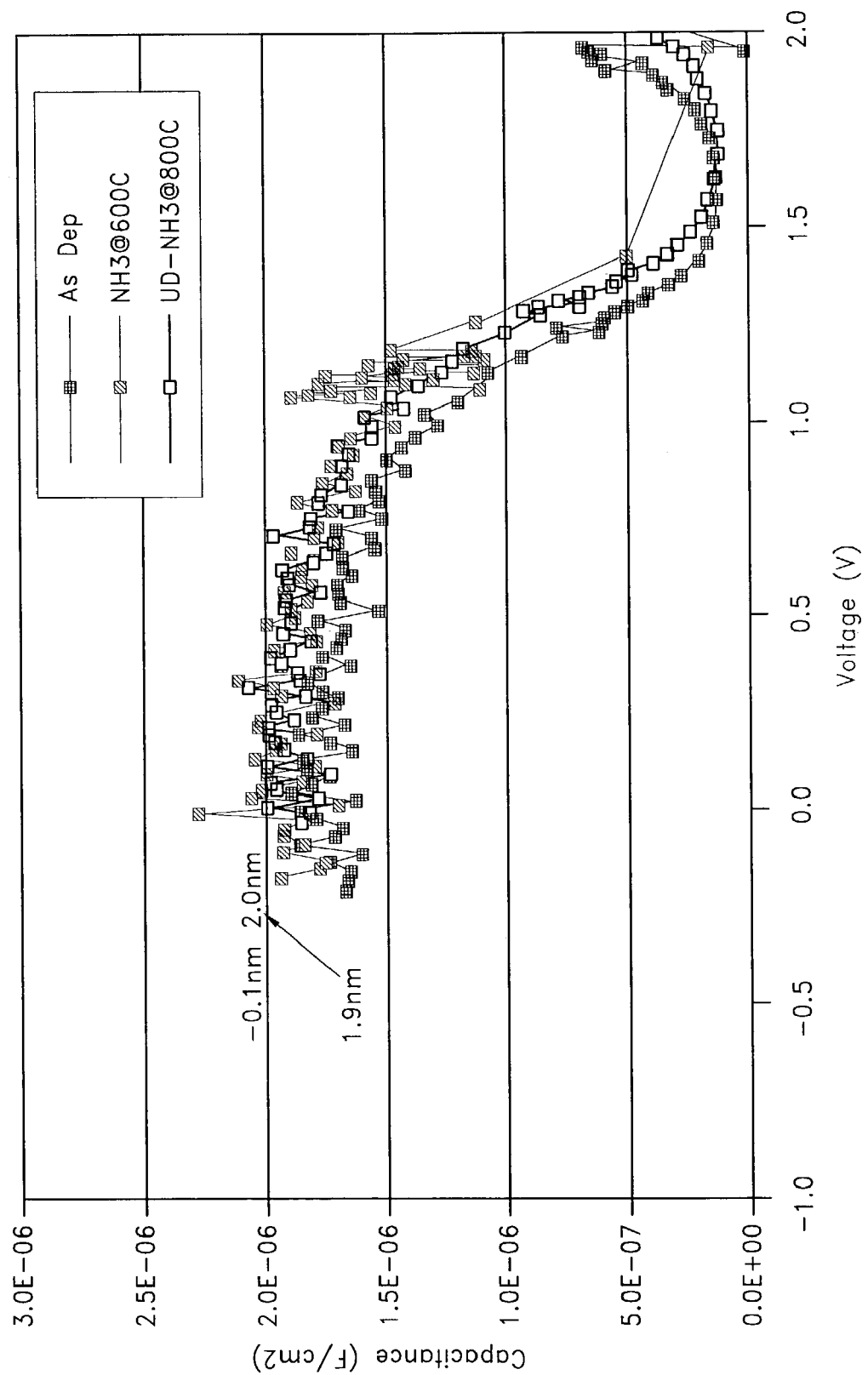
FIG. 9 is a capacitance-voltage curve showing electrical behavior (and consequently calculated equivalent oxide thickness) after annealing a dielectric stack of 4 nm $HfO_2$ over 0.5 nm silicon oxide in $NH_3$ at two different temperatures.

Capacitance-voltage curves for post-deposition anneals of 4 nm $HfO_2$ layers deposited on 0.5 nm RTO under $NH_3$ are illustrated in FIG. 9. In this experiment, the EOT parameter for the $HfO_2$ layer as deposited was 2.0 nm. Annealing under $NH_3$ at 600° C. for 60 s reduced the EOT parameter slightly to 1.9 nm. Annealing under $NH_3$ at 800° C. for 60 s resulted in an $HfO_2$ layer with an EOT parameter that was unmeasurable by the instrumentation used in these experiments.

In view of the present disclosure, annealing conditions under which preferential oxide regrowth of the interfacial dielectric 24 occurs may be readily ascertained by one skilled in the art without undue experimentation. More preferably, conditions for the high-k anneal are selected under which the thickness of the interfacial dielectric 24 does not increase.

One skilled in the art will further appreciate that post-deposition anneal conditions that do not increase the thickness of the interfacial dielectric layer 24 in FIG. 5 may also advantageously be used to lightly oxidize or nitridize structures such as those illustrated in FIG. 2 to provide the structures illustrated in FIG. 3.

In view of the present disclosure, the skilled artisan could select, without undue experimentation, annealing conditions comprising an oxygen or nitrogen source chemical, temperature, and time that will result in the preferential oxidation of the substrate in the gaps between the grain boundaries for any given high-k layer deposited thereon, resulting in a non-uniform and preferably discontinuous silicon oxide, silicon nitride, or silicon oxynitride layer.

It will be appreciated by those skilled in the art that various modifications and changes may be made without departing from the scope of the invention. Such modifications and changes are intended to fall within the scope of the invention, as defined by the appended claims.

We claim:

1. A method of forming an integrated circuit, comprising:
providing a conductive surface, wherein the conductive surface comprises a semiconductor surface;
forming a discontinuous high-k dielectric layer on the conductive surface, wherein a thickness of the discontinuous high-k dielectric layer is less than about $2\times(k/4)$ nm; and
blocking potential current leakage paths in physical gaps of the discontinuous high-k dielectric layer with a second insulating material.

2. The method of claim 1, wherein the second insulating material is amorphous.

3. The method of claim 2, wherein the second insulating material comprises silicon dioxide.

4. The method of claim 2, wherein blocking comprises oxidizing exposed portions of the conductive surface through the gaps in the discontinuous high-k dielectric layer.

5. The method of claim 2, wherein blocking comprises depositing a silicon oxide layer over the discontinuous high-k dielectric layer.

6. The method of claim 1, wherein blocking potential current leakage paths comprises annealing the conductive surface and the discontinuous high-k dielectric layer in the presence of a reactive source chemical, thereby preferentially covering portions of the conductor exposed in the gaps with a second insulating material.

7. The method of claim 6, wherein the reactive source chemical comprises an oxygen-containing gas, and the second insulating material comprises silicon and oxygen.

8. The method of claim 6, wherein the reactive source chemical comprises a nitrogen-containing gas, and the second insulating material comprises silicon and nitrogen.

9. The method of claim 6, wherein the conductive surface comprises a silicon structure.

10. The method of claim 9, wherein the silicon structure comprises a single crystal silicon substrate.

11. The method of claim 9, wherein the silicon structure comprises hemispherical grained silicon.

12. The method of claim 6, wherein the second insulating material has a dielectric constant lower than a dielectric constant of the high-k dielectric layer.

13. The method of claim 1, wherein:
the high-k dielectric layer has a bulk dielectric constant k and a thickness of no more than about $1.5\times(k/4)$ nm; and
blocking potential current leakage paths comprises annealing the high-k dielectric layer in a reactive atmosphere to form a layer of second dielectric material below the high-k dielectric layer, wherein the layer of second dielectric material has a non-uniform thickness.

14. The method of claim 13, wherein the second dielectric material has a lower dielectric constant than the high-k dielectric layer.

15. The method of claim 13, wherein the reactive atmosphere comprises an oxygen-containing gas.

16. The method of claim 15, wherein the reactive atmosphere contains ozone.

17. The method of claim 13, wherein the reactive atmosphere comprises a nitrogen-containing gas, and the second dielectric material comprises silicon nitride.

18. The method of claim 13, wherein the second dielectric material preferentially forms on the conductive structure below the gaps in the high-k film.

19. The method of claim 13, wherein forming the high-k dielectric layer comprises an atomic layer deposition (ALD) process.

20. The method of claim 13, wherein the reactive atmosphere comprises radicals selected from the group consisting of nitrogen, oxygen, and combinations thereof.

21. A method of forming an integrated circuit, comprising:
providing a conductive surface, wherein the conductive surface comprises a semiconductor surface;
forming a discontinuous high-k dielectric layer on the conductive surface, wherein
the high-k dielectric layer comprises a metal oxide containing an element selected from groups IIA, IIIB, and IVB of the periodic table, and
a thickness of the discontinuous high-k dielectric layer is less than about $2\times(k/4)$ nm; and
blocking potential current leakage paths in physical gaps of the discontinuous high-k dielectric layer with a second insulating material, wherein
blocking potential current leakage paths comprises annealing the conductive surface and the discontinuous high-k dielectric layer in the presence of a reactive source chemical, thereby preferentially covering portions of the conductor exposed in the gaps with a second insulating material, and
the second insulating material has a dielectric constant lower than a dielectric constant of the high-k dielectric layer.

* * * * *